(12) United States Patent
Wakchaure et al.

(10) Patent No.: US 10,877,696 B2
(45) Date of Patent: Dec. 29, 2020

(54) INDEPENDENT NAND MEMORY OPERATIONS BY PLANE

(71) Applicant: Intel Corporation, Santa Clara, CA (US)

(72) Inventors: Yogesh B. Wakchaure, Folsom, CA (US); Aliasgar S. Madraswala, Folsom, CA (US); David J. Pelster, Longmont, CO (US); Donia Sebastian, Fair Oaks, CA (US); Curtis Gittens, Vancouver (CA); Xin Guo, San Jose, CA (US); Neelesh Vemula, Sunnyvale, CA (US); Varsha Regulapati, Folsom, CA (US); Naga Kiranmayee Upadhyayula, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/367,638

(22) Filed: Mar. 28, 2019

(65) Prior Publication Data

US 2019/0227749 A1    Jul. 25, 2019

(51) Int. Cl.
*G06F 12/00* (2006.01)
*G06F 3/06* (2006.01)
*G11C 16/26* (2006.01)
*G11C 16/04* (2006.01)
*G11C 11/56* (2006.01)

(52) U.S. Cl.
CPC .......... *G06F 3/0659* (2013.01); *G06F 3/0604* (2013.01); *G06F 3/0688* (2013.01); *G11C 16/0483* (2013.01); *G11C 16/26* (2013.01); *G11C 11/5628* (2013.01); *G11C 11/5642* (2013.01); *G11C 11/5671* (2013.01); *G11C 2216/22* (2013.01)

(58) Field of Classification Search
CPC ............................. G06F 3/0604; G06F 3/0688
See application file for complete search history.

*Primary Examiner* — Gurtej Bansal
(74) *Attorney, Agent, or Firm* — Compass IP Law, PC

(57) ABSTRACT

Independent multi-plane commands for non-volatile memory devices are described. In one example, a three-dimensional (3D) NAND memory device includes 3D NAND dies, each die including multiple planes of memory cells. The device includes input/output (I/O) circuitry to receive multiple commands from a host, each of the received commands to access one of the planes. The device includes logic (which can be implemented with, for example, an ASIC controller, firmware, or both) to queue the commands in separate queues for each of the planes based on a target plane of each of the commands. The logic issues the commands to their target planes independent of other planes' status, and tracks completion status of the commands independently for each plane.

20 Claims, 19 Drawing Sheets

| Operation | CMD | ADDR1 | ADDR2 | ADDR3 | | Wr_data1 | Polling |
|---|---|---|---|---|---|---|---|
| Set trim by plane | E7 | LSB trim address | MSB trim address | LUN | | P1 | BUSY |
| | | | | [2:0] | | | |
| | | | | Plane | | | |
| | | | | [6:4] | | | |

| Operation | CMD | ADDR1 | ADDR2 | ADDR3 | | Polling | Rd_data1 |
|---|---|---|---|---|---|---|---|
| Get trim by plane | E6 | LSB trim address | MSB trim address | LUN | | | P1 |
| | | | | [2:0] | | | |
| | | | | Plane | | | |
| | | | | [6:4] | | | |

| Operation | CMD | ADDR1 | | ADDR2 | Wr_data1 | Wr_data1 | Wr_data2 | Wr_data3 | Wr_data4 | Polling |
|---|---|---|---|---|---|---|---|---|---|---|
| Set feature by plane | E5 | LUN | | FA | P1 | | P2 | P3 | P4 | BUSY |
| | | [2:0] | | | | | | | | |
| | | Plane | | | | | | | | |
| | | [6:4] | | | | | | | | |

FIG. 8A

| Operation | CMD | ADDR1 | | ADDR2 | Polling | Rd_data1 | Rd_data2 | Rd_data3 | Rd_data4 |
|---|---|---|---|---|---|---|---|---|---|
| | | LUN [2:0] | Plane [6:4] | | | | | | |
| Get feature by plane | E4 | | | FA | BUSY | P1 | P2 | P3 | P4 |

| Operation | CMD | ADDR1 | | Rd_data1 |
|---|---|---|---|---|
| | | LUN [2:0] | Plane [6:4] | |
| Status by plane | 72 | | | Rd_data1 |

| Operation | CMD | ADDR1 | | CMD | ADDR1 | ADDR1 | CMD |
|---|---|---|---|---|---|---|---|
| | | LUN [2:0] | Plane [6:4] | | | Col Addr | |
| Read Col. Enhanced (Option 1) | 72 | | | 3 | | | E0 |

FIG. 8B

| Operation | CMD | ADDR1 | ADDR2 | ADDR3 | ADDR4 | ADDR5 | ADDR6 | CMD | Rd_data1 |
|---|---|---|---|---|---|---|---|---|---|
| Read Col. Enhanced (Option 2) | 03 | Col address | | | Row address | | | E0 | |

| Operation | CMD | ADDR1 | ADDR2 | ADDR3 | ADDR4 | ADDR5 | ADDR6 | CMD |
|---|---|---|---|---|---|---|---|---|
| Prefix opcode for TLC Entry for IMPRO (AutoExit enabled only) | 41 | 00h | Col address | | Row address | | | 20h |

| Operation | CMD | ADDR1 | ADDR2 | ADDR3 | ADDR4 | ADDR5 | ADDR6 | CMD |
|---|---|---|---|---|---|---|---|---|
| Prefix opcode for TLC Entry for IMPRO (AutoExit enabled only) | 43 | 00h | Col address | | Row address | | | 20h |

FIG. 8C

| Status bit | Description |
|---|---|
| SR7_Px | WP |
| SR6_Px | RDY_Px |
| SR5_Px | ARDY_Px |
| SR4_Px | PERESET/WP# |
| SR3_Px | Thermal |
| SR2_Px | Suspend |
| SR1_Px | FAILC |
| SR0_Px | FAIL |

1000

ISSUE A COMMAND TO TARGET A FIRST PLANE OF A
NON-VOLATILE MEMORY
1002

ISSUE A SECOND COMMAND TO TARGET A SECOND PLANE
WHILE THE FIRST PLANE IS BUSY
1004

TRACK COMPLETION OF THE COMMANDS INDEPENDENTLY
BY POLLING THE STATUS AT A PLANE-LEVEL
1006

RECEIVE A FIRST COMMAND TO TARGET A FIRST PLANE OF A
NON-VOLATILE MEMORY
1022

START SERVICING THE FIRST COMMAND
1024

RECEIVE A SECOND COMMAND TO TARGET A SECOND PLANE
WHILE THE FIRST COMMAND IS BEING SERVICED
1026

START SERVICING THE SECOND COMMAND INDEPENDENT OF
THE STATUS OF THE FIRST PLANE
1028

FIG. 10B

INDEPENDENT NAND MEMORY OPERATIONS BY PLANE

FIELD

The descriptions are generally related to non-volatile storage media such as NAND flash memory.

BACKGROUND

Flash storage, such as NAND flash memory, is a non-volatile storage medium. Nonvolatile storage refers to storage having a state that is determinate even if power is interrupted to the device. Three dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low read and write latencies, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIGS. 8A-8C illustrate examples of independent plane-level commands.

FIGS. 10A and 10B are examples of flow diagrams of independent multi-plane operations.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for performing independent and concurrent memory operations by plane in a non-volatile memory are described herein. One such non-volatile memory is NAND memory.

Current generation NAND memories are typically manufactured with three-dimensional (3D) NAND technology. With 3D NAND memories, "scaling" happens by adding more tiers (layers) of NAND cells to increase memory packing per silicon surface area. With more tiers added, NAND die size tends to increase to accommodate more routing signals and also the periphery CMOS size increase leads to die size increase. NAND array performance, on other hand, is typically flat over generation to generation. Also, NAND today only handles a single array command (e.g., read, program, or erase) at a time. As a result, with increasing die size, performance/density (which is typically regarded to be one of the key Solid State Drive (SSD) metrics) is degrading over NAND generations.

In one example, independent plane-level commands enable significant performance increases by enabling commands to start independently on each plane. In one such example, separate plane-level queues on the controller-side enable commands to be queued and dispatched independently to the planes. Separate command state machines for each plane on the memory-side enable the memory to accept and process commands independently for each plane. Separate ready/busy signals for each plane enable the controller to poll the memory at a plane-level to track completion and readiness of each plane for receiving additional commands. Thus, commands can be serviced independently per plane, enabling performance metrics such as performance/density.

Figure 1:
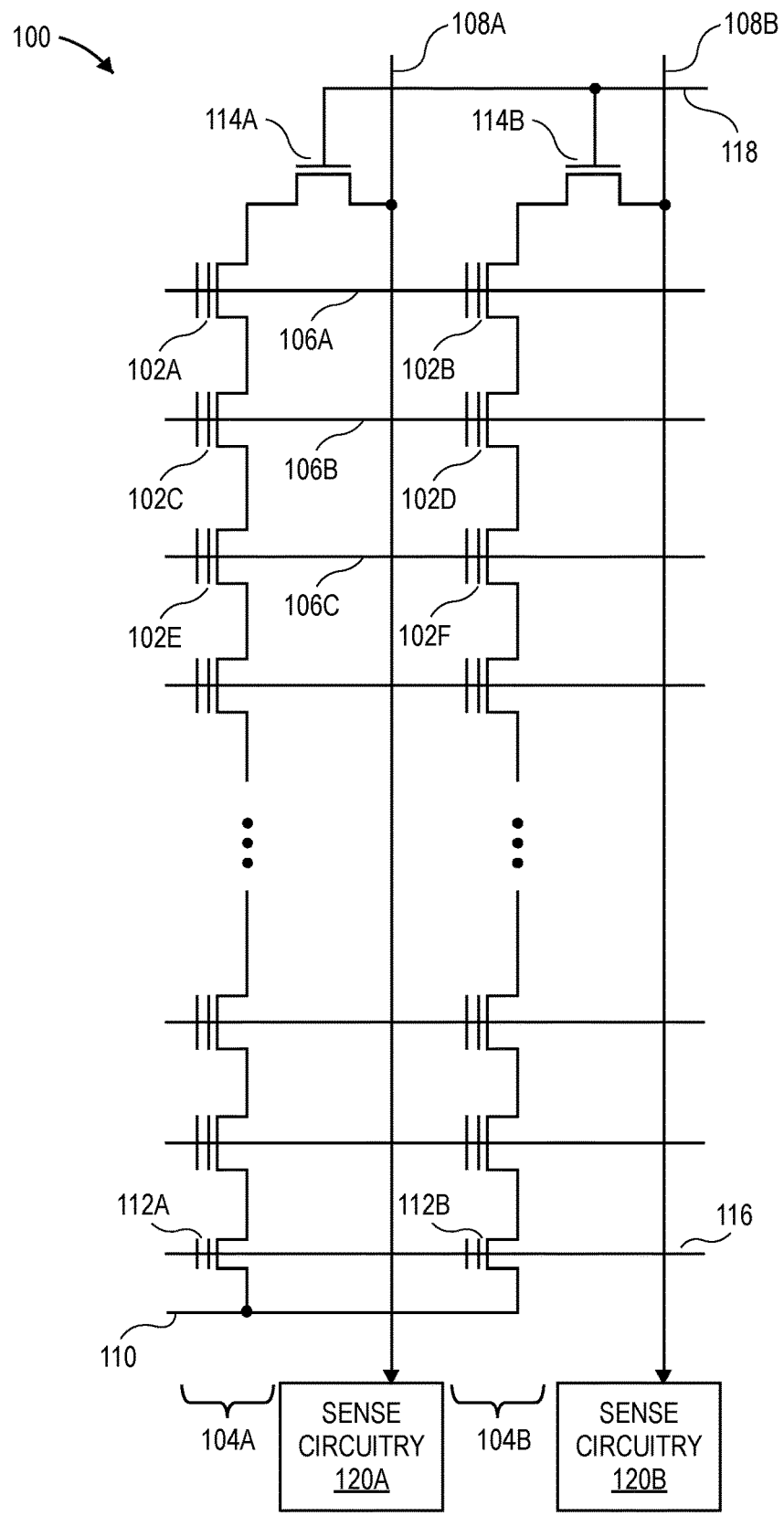
FIG. 1 depicts an example portion of a NAND flash memory array in which independent multi-plane techniques can be implemented.

FIG. 1 depicts an example portion of a NAND flash memory array 100 in which independent NAND memory operations can be implemented. The NAND flash memory array 100 includes multiple non-volatile memory cells 102A-102F (abbreviated as 102) arranged in columns, such as series strings 104A and 104B (abbreviated as 104). In one example, the memory cell 102 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 102 can include a transistor with a floating gate (e.g., a high resistance poly gate) that stores charge indicative of one or more bit values. Other architectures are also possible. In the series strings 104, drain regions of cells 102 are (with the exception of the top cell) coupled to a source region of another cell 102.

The array 100 also includes wordlines 106A-106C. The wordlines 106A-106C can span across multiple series strings 104 (e.g., a wordline may be coupled to one memory cell of each series string 104) and are connected to the control gates of each memory cell 102 of a row of the array 100 and used to bias the control gates of the memory cells 102 in the row. The bitlines 108A and 108B (abbreviated as 108) are each coupled to a series string 104 by a drain select gate 114 and sensing circuitry 120A and 120B that detects the state of each cell by sensing voltage or current on a particular bitline 108.

Multiple series strings 104 of the memory cells are coupled to a source line 110 by a source select gate 112A and 112B (abbreviated as 112) and to an individual bitline 108 by a drain select gate 114A and 114B (abbreviated as 114). The source select gates 112 are controlled by a source select gate control line 116 and the drain select gates 114 are controlled by a drain select gate control line 118.

Figure 2:
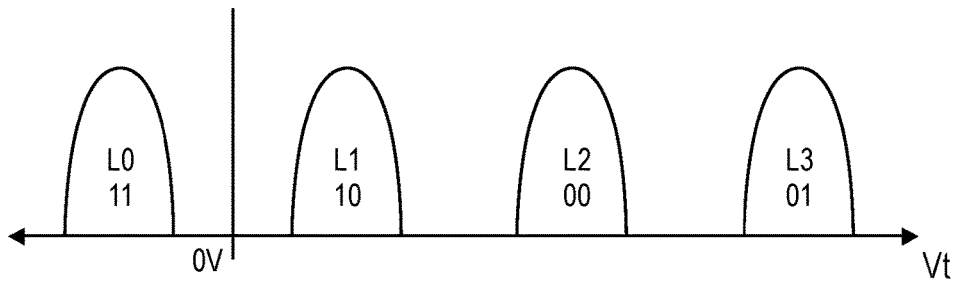
FIG. 2 illustrates an example of threshold voltage distributions for a NAND flash cell.

In some examples, each memory cell 102 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell. For example, FIG. 2 illustrates an example of threshold voltage distributions for a cell with four levels or states. Level 0 (L0) corresponds to an erase state of 11, level 1 (L1) corresponds to a first program level of 10, Level 2 (L2) corresponds to a second program level of 00, and Level 3 (L3) correspond to a program level of 01. Thus, the example in FIG. 2 is for a multi-level cell that can store 2 bits of data.

In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a wordline (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 3:
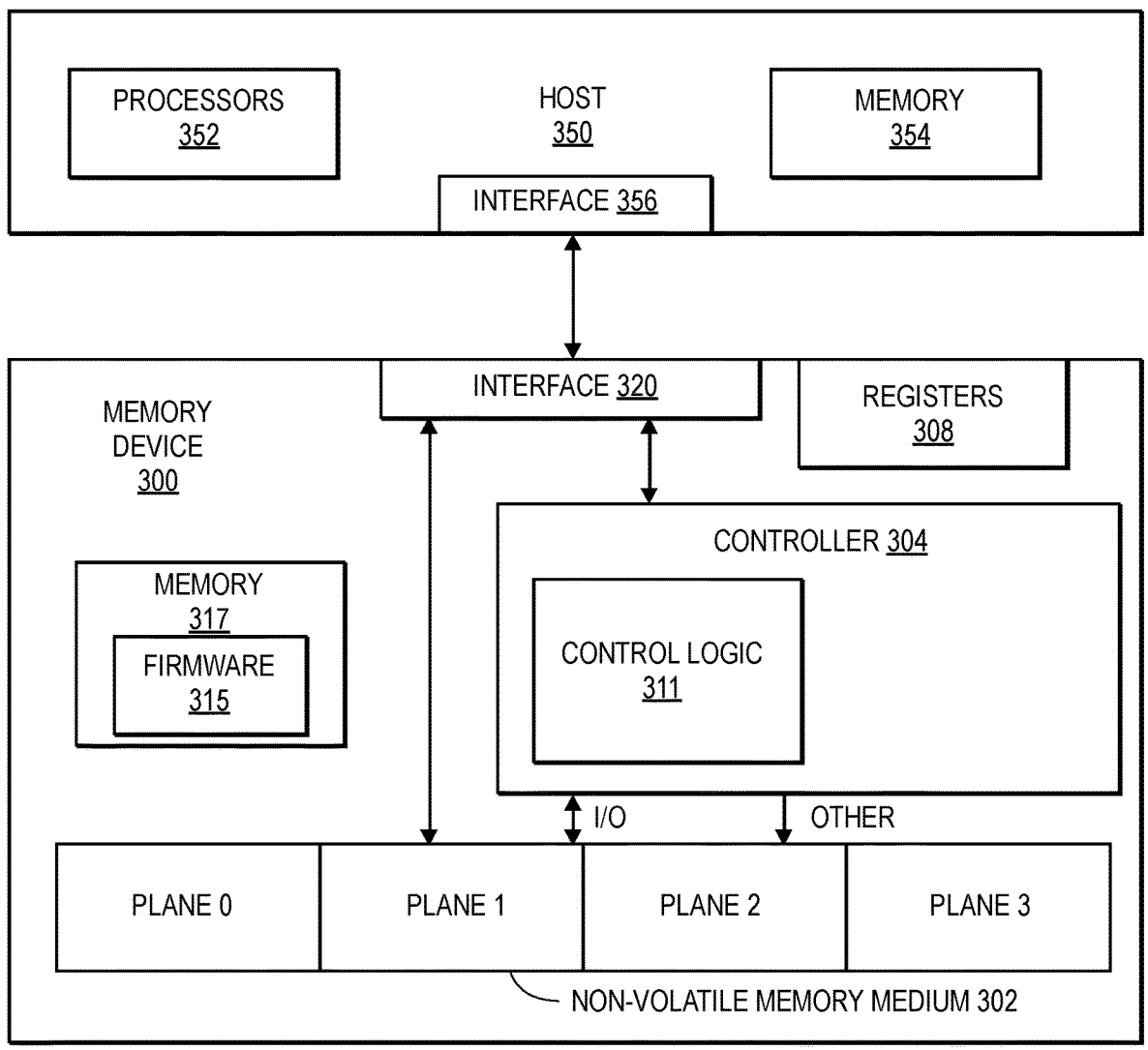
FIG. 3 depicts an example system.

FIG. 3 depicts an example system. The system includes a host 350 and a memory device 300. The host 350 and memory device 300 can be an example of a system that exists within the confines of a computer's package (e.g., within a laptop/notebook, server, or other computer). In other examples, the memory device 300 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 350 includes one or more processors 352, memory 354, and other components that are omitted from the drawing for clarity.

The memory device includes a memory medium 302 for storing data. Memory medium 302 can be a memory or storage medium that can store one or more bits in memory cells. For example, the memory medium 302 can include non-volatile and/or volatile types of memory. In one example, the memory medium 302 includes one or more non-volatile memory die, each divided into multiple planes or groups. In some examples, the memory medium 302 can include block addressable memory devices, such as NAND technologies. In one example, the memory medium 302 includes a NAND flash memory array such as the array in FIG. 1. The memory medium 302 can also include non-volatile types of memory, such as 3D crosspoint memory (3DxP), or other byte addressable non-volatile memory. Other technologies, such as some NOR flash memory, may be byte addressable for reads and/or writes, and block addressable for erases. The memory medium 302 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 302 can include a single-level cell (SLC) NAND storage device, a multi-level cell (MLC) NAND storage device, triple-level cell (TLC) NAND storage device, quad-level cell (QLC) storage device.

According to some examples, volatile types of memory included in the memory medium 302 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The memory device 300 can communicate with a host system 350 using respective interfaces 320 and 356. In one example, the interface 356 is a part of a peripheral control hub (PCH). In the illustrated example, the controller 304 is coupled with a computing platform such as host 350 using the interface 320. In one example, the controller 304 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 304 can communicate with elements of the computing platform to read data from memory medium 302 or write data to memory medium 302. Although in this disclosure, the term "host" is referring to a system with a processor (or other device sending requests to access data stored in a non-volatile memory) and an interface for communicating with the NAND (e.g., the host 350), some implementations may refer to the controller 304 as a "host" relative to the non-volatile memory medium 302.

The controller 304 can be configured to receive requests from the host 350 and generate and perform commands concerning the use of memory medium 302 (e.g., to read data, write, or erase data). Other commands may include, for example, commands to read status, commands to change configuration settings, a reset command, etc. The controller can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The memory device typically also includes memory 317 coupled to the logic circuitry 311 which can be used to cache NVM data and store firmware 315 executed by the controller 304. The term "control logic" can be used to refer to both logic circuitry, firmware, software, or a combination. For example, control logic can refer to the control logic 311, firmware 315, or both. Although firmware is illustrated as being stored in memory 317, firmware may also or alternatively be stored in the controller 304 and/or the memory die.

The controller 304 is coupled with the memory medium 302 to control or command the memory to cause operations to occur (e.g., read, program, erase, suspend, resume, and other operations). Communication between the memory medium 302 and the controller 304 may include the writing to and/or reading from specific registers (e.g., registers 308). Such registers may reside in the controller 304, in the memory medium 302, or external to the controller 304 and the memory medium 302. Registers or memory within the memory medium 302 may be reachable by the controller 304 by, e.g., an internal interface of the memory device 300 that exists between the controller 304 and memory medium 302 (e.g., an Open NAND Flash Interface (ONFI) interface, a proprietary interface, or other interface) to communicatively couple the controller 304 and memory medium 302. Input/output (I/O) pins and signal lines communicatively couple the controller 304 with the memory medium 302 to enable the transmission of read and write data between the controller 304 and the memory medium 302. The I/O pins may also be used to transmit other data, such as status information of the dies or planes of memory medium 302. The memory medium 302 can also include other pins such as command pins (e.g., command latch enable (CLE), address latch enable (ALE), chip enable (CE #), read enable (RE #), and write enable (WE #)), power and ground pins (e.g., Vcc, Vss, etc.). In one example, the memory medium includes a pin for indicating ready/busy status. However, in implementations with many memory dies in a package, it is often impractical to use a dedicated ready/busy pin for each die. Instead, in some examples, status can be output on the I/O pins of the dies in response to a request to read status.

The controller 304 can be coupled to word lines of memory medium 302 to select one of the word lines, apply read voltages, apply program voltages combined with bit line potential levels, or apply erase voltages. The controller 304 can be coupled to bit lines of memory medium 302 to read data stored in the memory cells, determine a state of the memory cells during a program operation, and control potential levels of the bit lines to promote or inhibit programming and erasing. Other circuitry can be used for applying selected read voltages and other signals to memory medium 302.

As mentioned above, the memory medium 302 can include a NAND memory. Typical NAND dies have multiple planes per die. A plane includes multiple memory cells which may be grouped into blocks. A block is typically the smallest erasable entity in a NAND flash die. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

Conventional NAND devices are capable of performing a read operation on one plane at a time. Such conventional NAND devices have a single state machine for the whole die. If a read is being serviced on one plane, the other planes are idle. Therefore, such conventional reads (called single plane reads) do not utilize all the planes at the same time. The lack of concurrency leads to high latency due to, for example, reads getting "stuck" behind other reads.

Another type of operation is a multi-plane operation (e.g., a quad plane read that performs a read on four planes at once). With multi-plane operations, there are multiple restrictions on the commands. For array commands, the array operation has to be the same (e.g., program, erase, or, read, but not a combination) and also the page type for those array operations has to be same. The voltage biasing to access different page types (e.g., lower page, upper page, etc.) is different, and the single state machine on the die applies the same voltage bias for all the planes. With real life random workloads, this requirement is hard to meet for read commands. The likelihood of receiving reads for the same page type on all four planes is low for a random workload. Therefore, the improvement in read latency with a quad plane read is minimal for a random workload. Accordingly, this feature is not typically utilized for random read workloads, which is typically considered to be a key workload for SSDs (solid state drives).

Another solution attempted was to combine reads of different page types on different planes into a single command. However, all those reads are handled as a single command by the NAND, which means there is single start and completion for the reads. Therefore, with such a technique the read duration is dominated by the worst (e.g., slowest) page type and asynchronous reads are not possible. Accordingly, combining different page types on different planes into a single command also results in minimal increases in performance and Quality of Service (QoS).

Figure 4B:
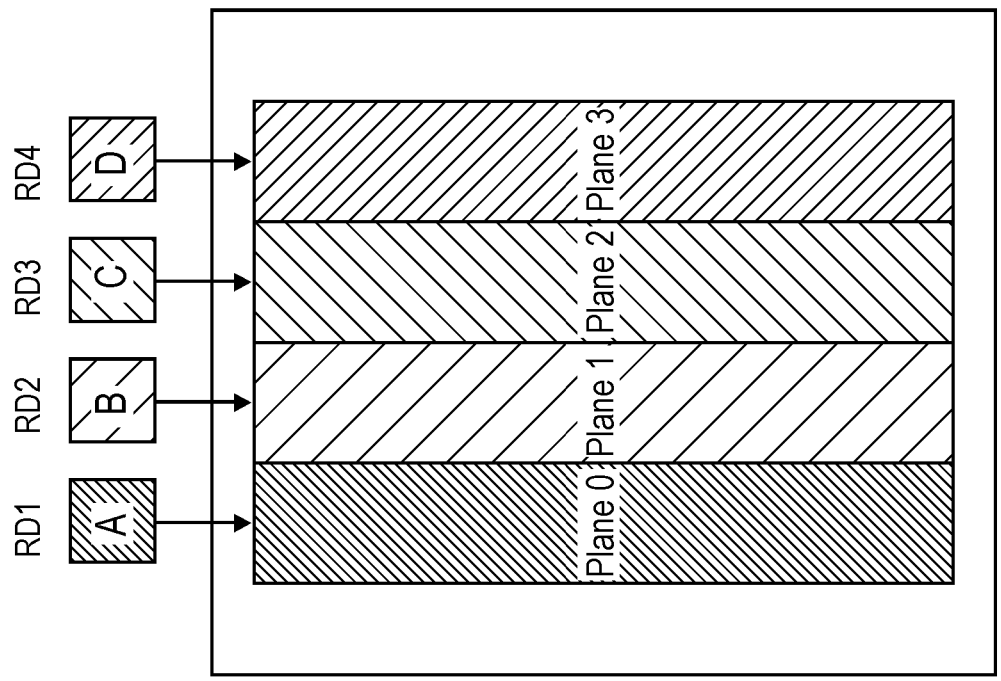
FIGS. 4A-4C illustrate examples of independent multi-plane operations.
Figure 4A:
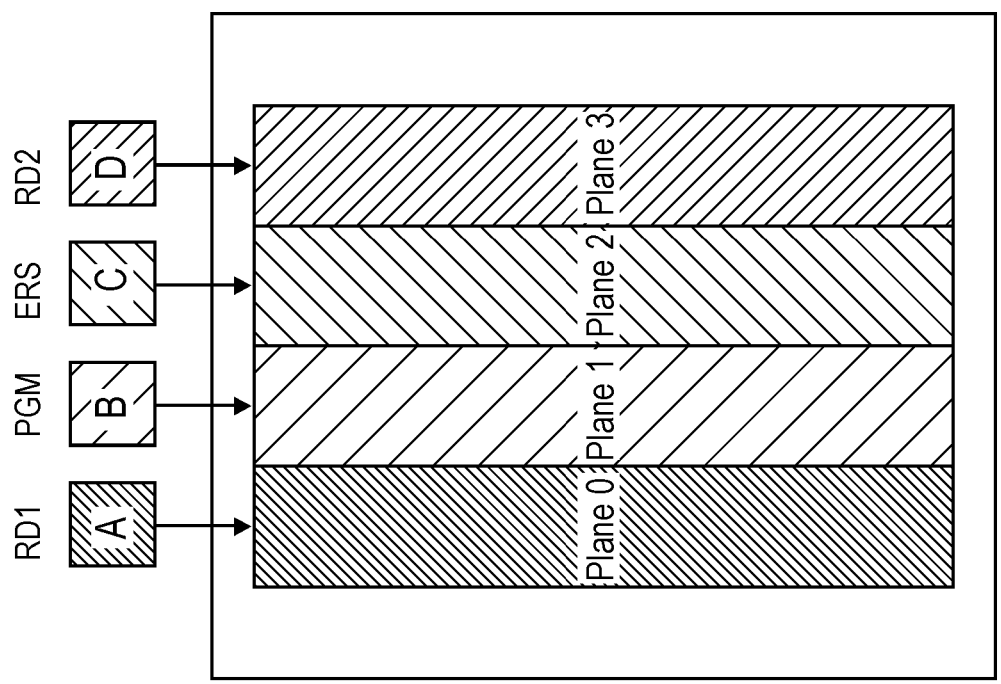
Figure 4C:
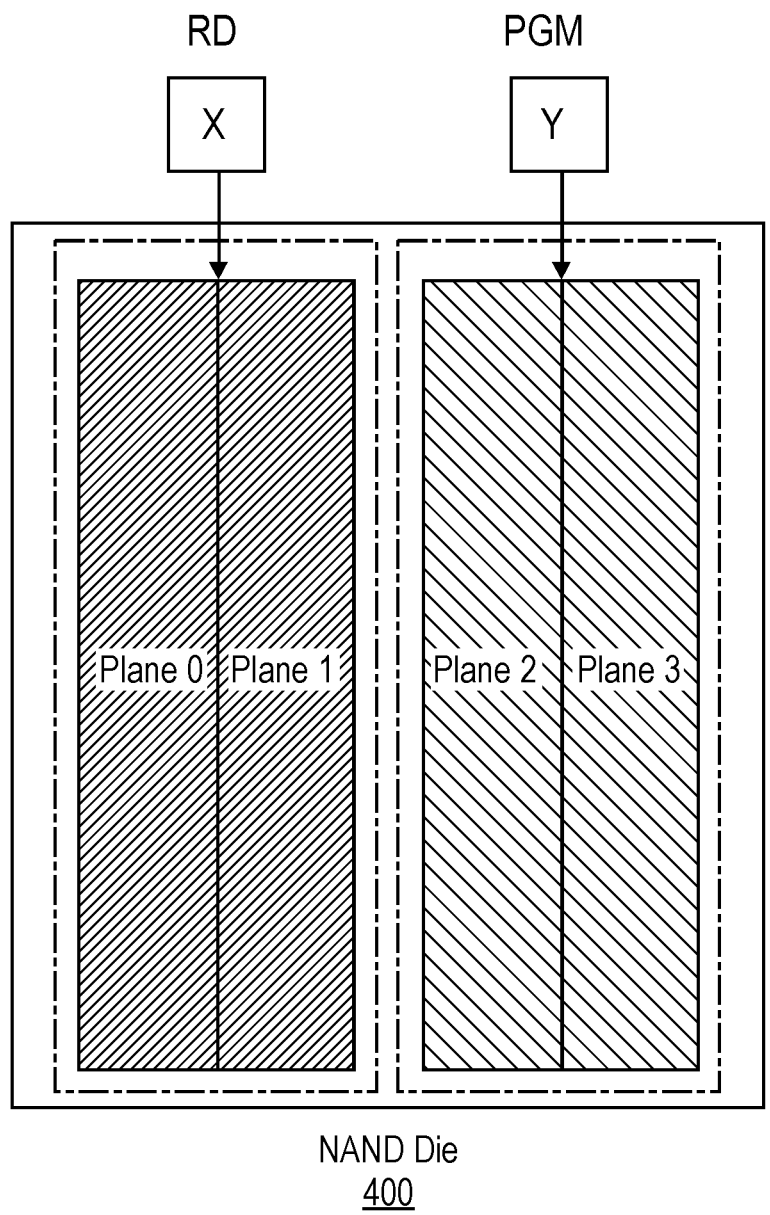

In contrast to conventional NAND operations, independent multi-plane operations enable independent and concurrent operations per plane. Separate state machines for each plane enable application of different bias voltages for each plane to independently and concurrently service requests. FIGS. 4A-4C illustrate examples of independent multi-plane operations. FIG. 4A illustrates an example of a fully independent multi-plane array operation (IMPO). FIG. 4B illustrates an example of an independent multi-plane read operation (IMPRO). FIG. 4C illustrates another example of an independent multi-plane array operation (IMPO or IMPRO "lite"). In all of FIGS. 4A-4C, the NAND die 400 includes four planes (plane 0, plane 1, plane 2, and plane 3). Although the examples in FIGS. 4A-4C describe four planes per NAND die, a NAND die may be divided into fewer or more than four planes (e.g., 1, 2, 8, etc.).

Referring to FIG. 4A, all NAND array commands are allowed independently on the plane level, enabling significant performance improvements. An array command is a command that causes an array operation, such as programming data to the array, reading data from the array, erasing a block, or other operations on the array. FIG. 4A illustrates an example where read commands (commands A and D) are sent to plane 0 and plane 3, a program command (command B) is sent to plane 1, and an erase command (command C) is sent to plane 2. Each plane can receive and service a different array command, and the commands can be sent and completed at different times. Non-array commands (e.g., reset, timing mode changes, etc.) can be maintained as die-level commands, which are described below in more detail.

Referring to FIG. 4B, read operations (and some supporting commands for reads) are allowed independently on the plane level. As illustrated, four reads (operations A, B, C, and D) are sent to planes 0, 1, 2, and 3. In this example, other operations, such as program and erase, are still die-level operations. Supporting commands for read, such as read status and read column enhanced (described below with respect to FIGS. 8A-8C) may also be plane-level commands.

FIG. 4C illustrates a "lite" version of independent plane-level operations in which groups of planes can allow one independent array operation amongst them. In this example, only reads or all array-operations can be sent to groups of planes independently. In one example, planes are grouped in pairs (e.g., each group includes two planes). Other implementations may include more than two planes in a group, or may group the array in other ways.

In these examples, the NAND commands are split into two groups: 1) plane/group level commands, and 2) die-level commands. The internal controller (e.g., ASIC) and/or firmware are aware of the distinction between plane-level and die-level commands and handles the two types of commands differently. For example, a "master queue" and a "slave queue" per plane/group level are implemented in the ASIC and/or firmware to handle the die-level and plane-level commands.

Figure 5:
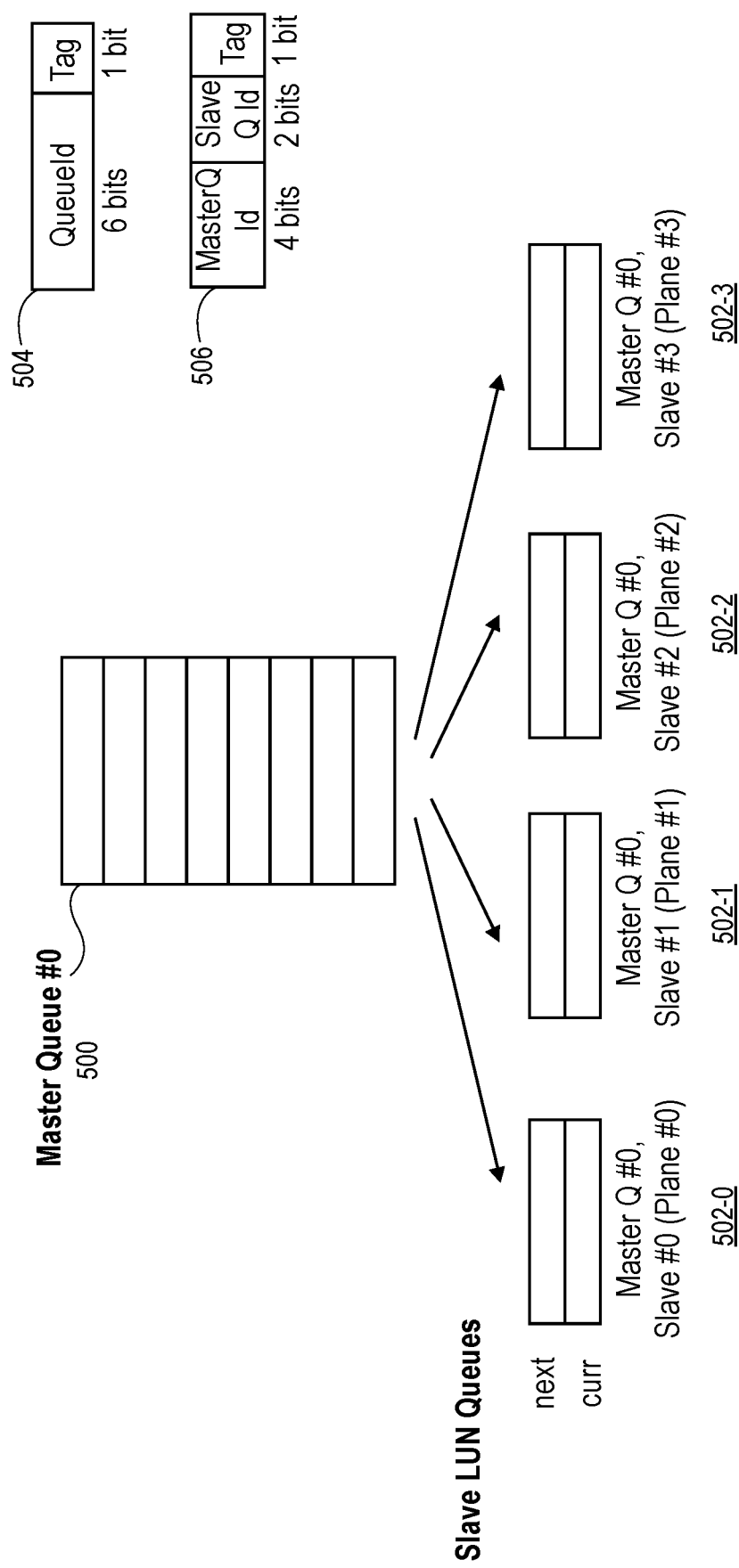
FIG. 5 illustrates an example of a master queue and plane-level slave queues.

FIG. 5 illustrates an example of a master queue and plane-level "slave" queues. The master queue 500 and plane-level queues 502-0-502-3 can be implemented in firmware, software, hardware, or a combination.

Conventional NAND controllers included a single command queue. Therefore, an entry in the command queue included a queue ID and a tag, such as the entry 504. Given that conventional implementations included only a single command queue, only a single queue ID field was needed. In contrast, an implementation with multiple queues may specify multiple queue identities. For example, the entry 506 includes both a MasterQ ID and a SlaveQ ID to indicate both the master queue (e.g., the die-level queue) and the slave queue (plane-level queue) that the command is routed to. Thus, commands issued by the controller will have information to indicate if the command is die level or plane/group level. In one example, all the commands first go to master queue 500, and the commands will be forwarded to the plane queues 502-0-502-3 based on the target plane indicated in the command Consider an example in which NAND commands can be split into two groups: 1) plane or group level commands, and 2) die level commands. The ASIC understands this command distinction and handles the commands accordingly. For example, the ASIC will have "slave Q" per plane/group level and also a "master Q" on die level to handle these commands. In one example, commands issued by firmware will have information to indicate if the command is die level or group level. All the commands first go to master Q, and HW will forward the commands to slave queue appropriately. If a command is die level, HW ensures all Slave Qs are empty before dispatching the command. HW will dispatch the die level command to one of the default Slave Q but will also send "dummy/ghost" command to other slave Qs to prevent them from executing any plane level command during the execution of die level command. If a command is plane level, HW will send the command to the Slave Q. From there, HW will poll the NAND to make sure that the plane is ready for next command, and then will issue command to NAND die once it is ready.

FIGS. 6A-6C and 7A-7B illustrate examples of queuing commands in a master queue and plane-level queues. FIGS. 6A-6C and 7A-7B each illustrate a host queue, a master queue for die 0 and plane-level queues for each plane of die 0. Although only a single master queue is shown in these examples, there can be a master queue for each die. In these examples, there are four plane-level queues for die 0 (one for each plane). Other implementations can include one queue for a group of planes instead of one queue for each plane. The host queue(s), master queues, and plane-level queues can be implemented in hardware (e.g., in the internal NAND controller) in firmware, in software, or a combination of hardware, firmware, and/or software. In one example, the queues can be implemented as first in first out (FIFO) memories (e.g., including logic gates to count writes and read and write pointers) or with data structures (e.g., an array, linked list, or other data structure) in firmware or software.

Figure 6A:
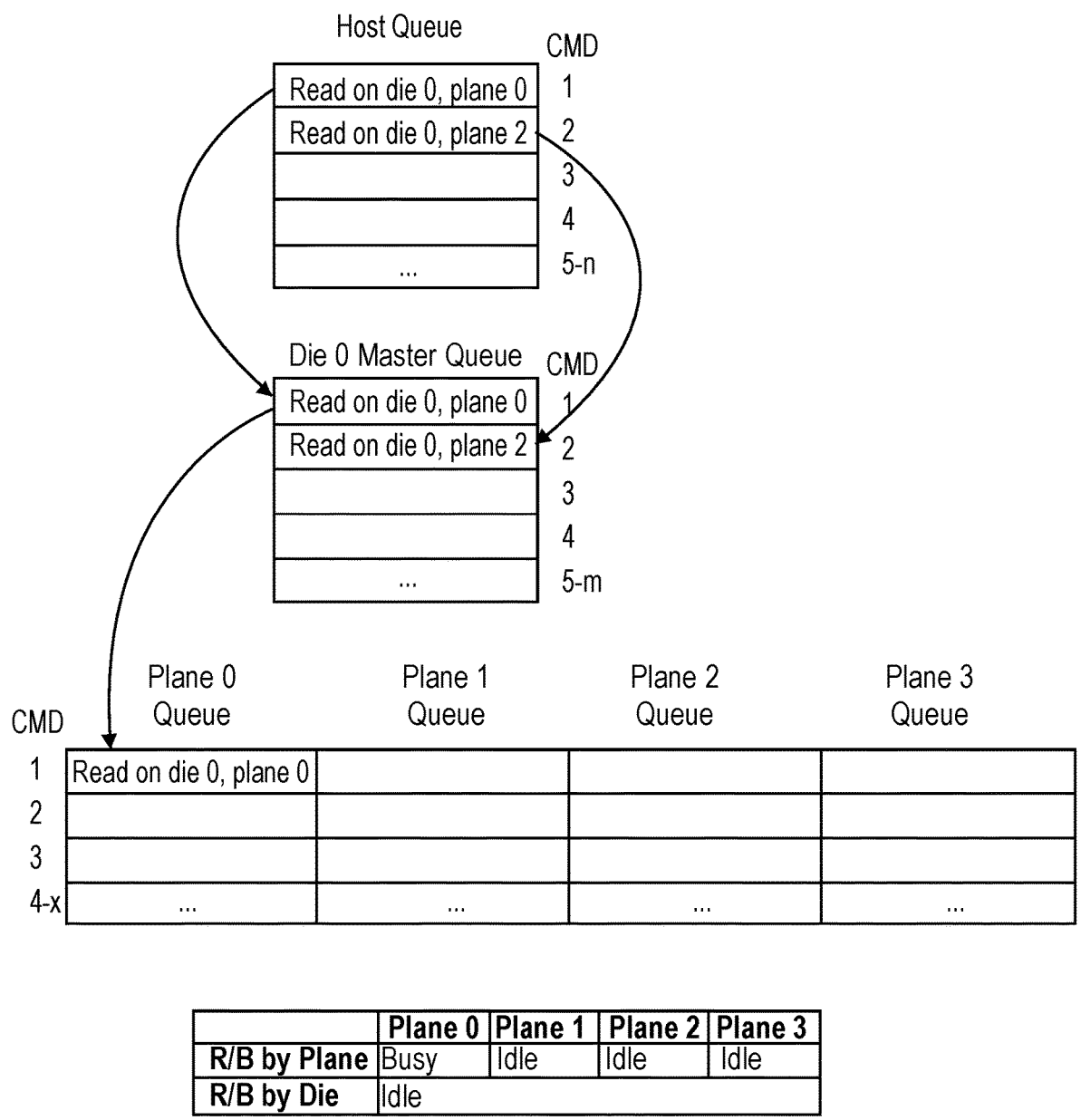
FIGS. 6A-6C and 7A-7B illustrate examples of queuing commands in a master queue and plane-level queues.
Figure 6B:
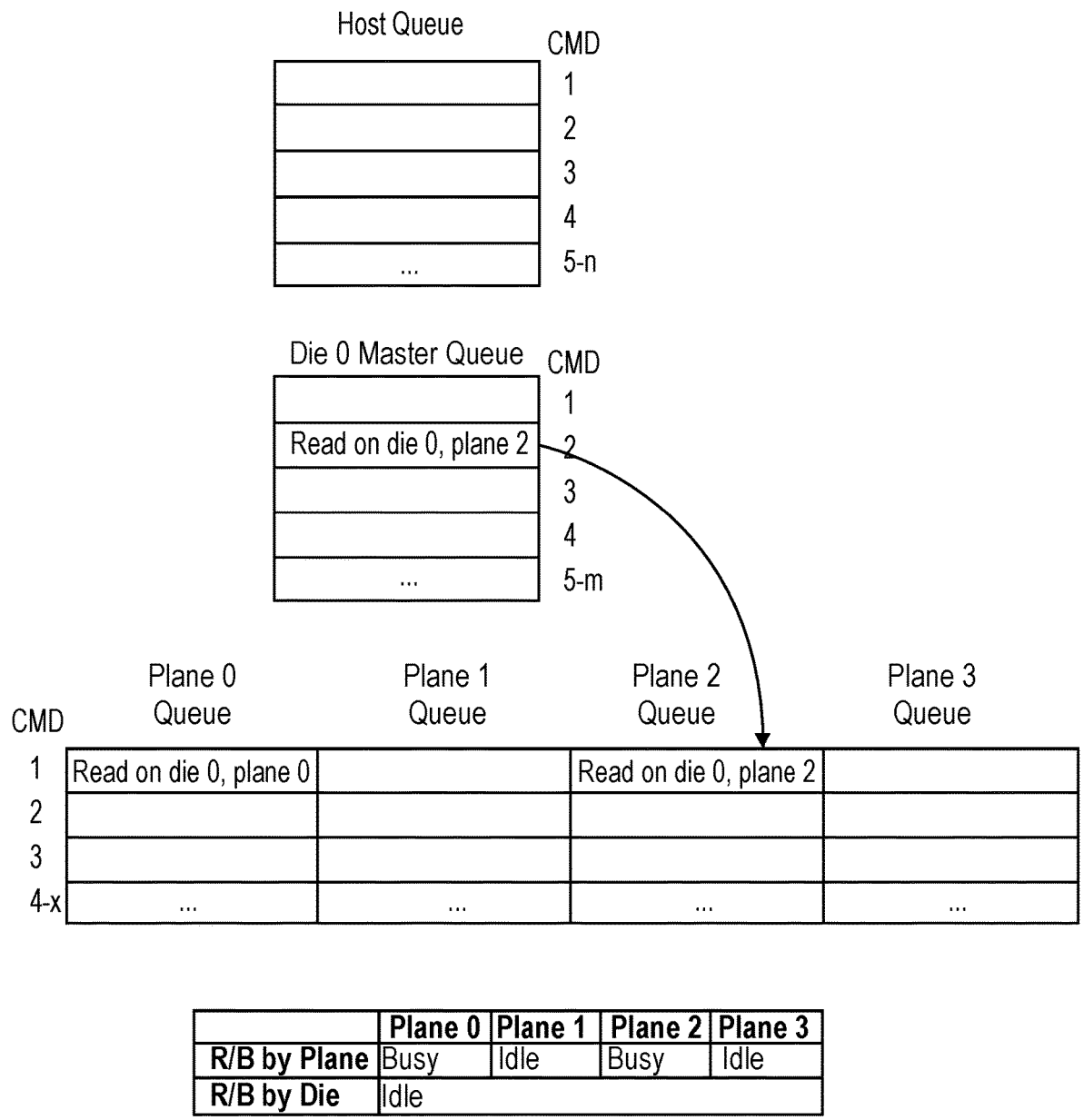
Figure 6C:
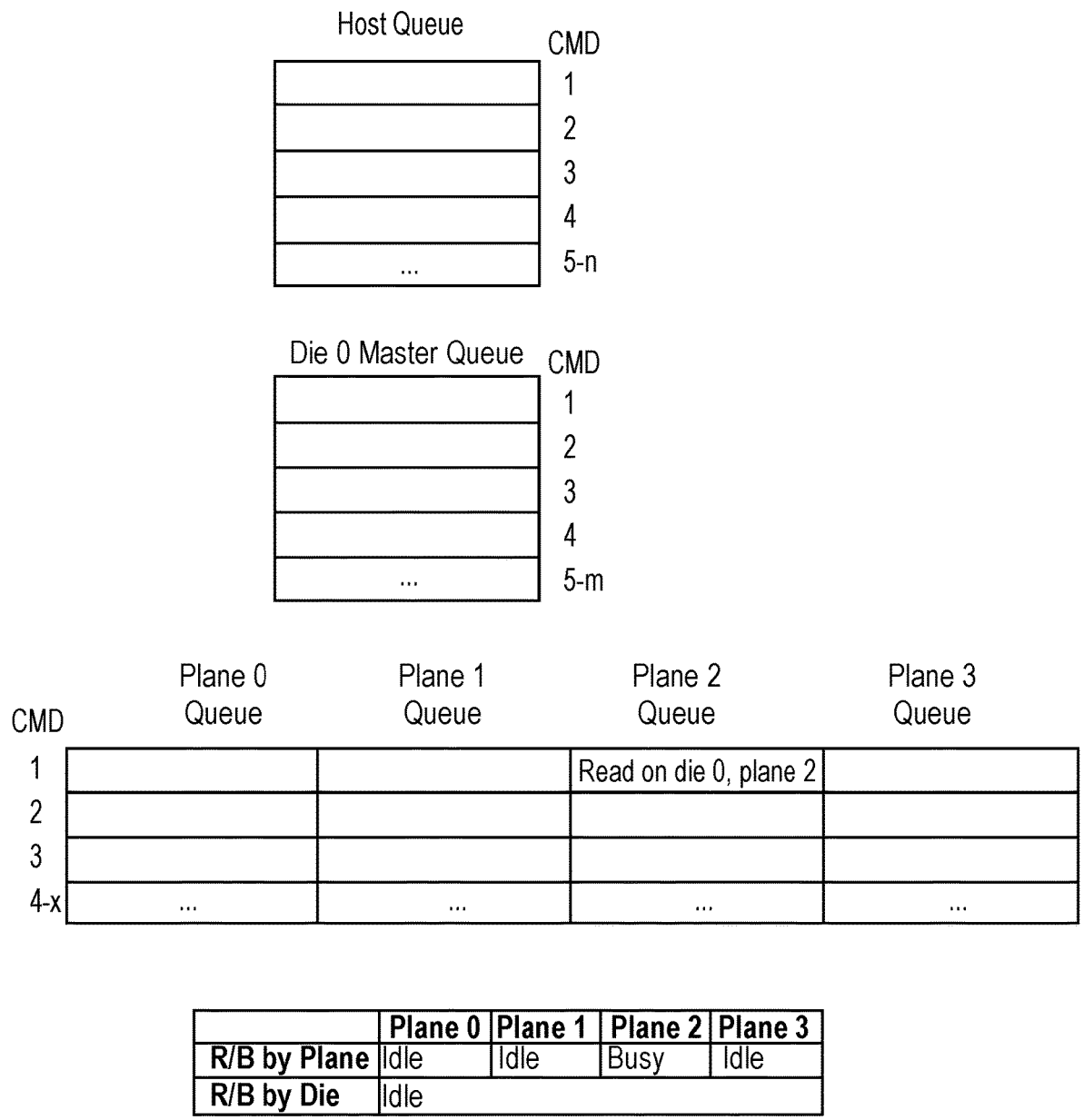
Figure 7A:
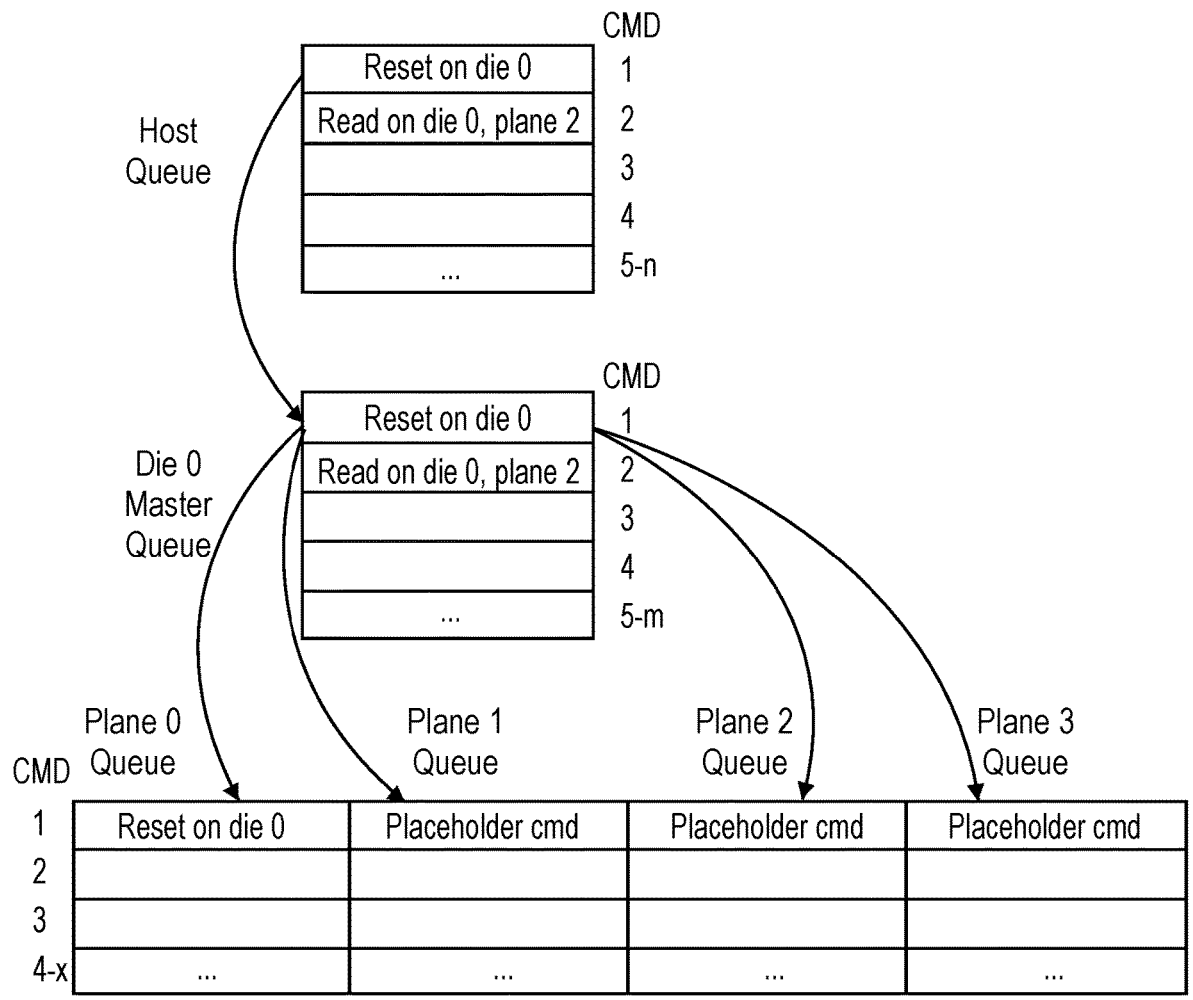
Figure 7B:
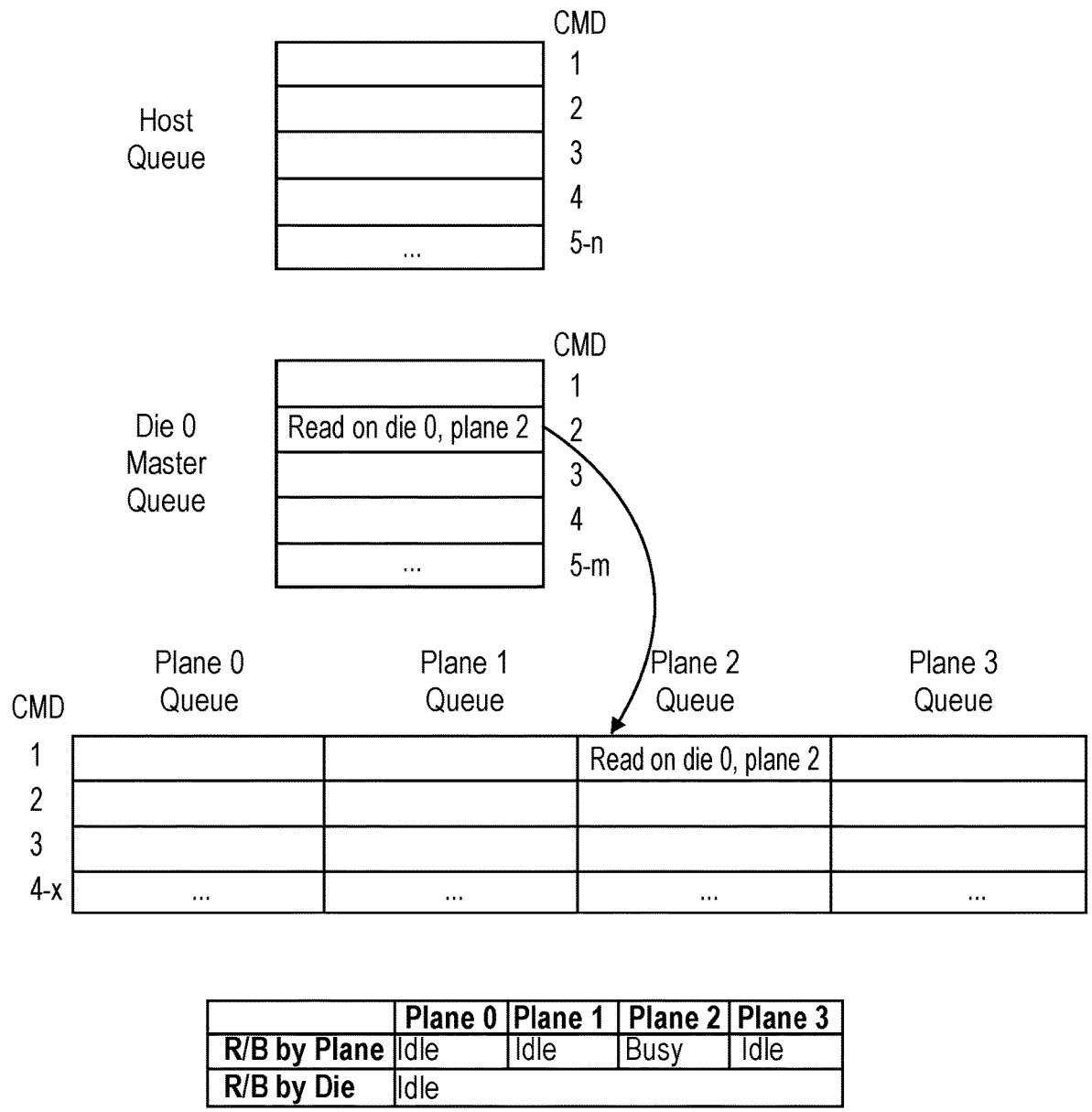

In these examples, the host queue is illustrated as having n entries to queue n commands (e.g., a depth of n). The master queue for die 0 is illustrated as having m entries for queuing m commands (e.g., a depth of m). Each plane queue is illustrated as having x entries for queuing x commands (e.g., a depth of x). The depth of the queues may be the same or different. In one example, the host queue receives all commands to service requests from the host. The master queue for each die receives commands targeting that die. The plane-level queues are then populated with entries from the master queue. FIGS. 6A-6C illustrates the handling of two plane-level commands and FIGS. 7A-7B illustrate the handling of a die-level command and a plane-level command. For clarity's sake, only a few commands for a single die are illustrated, however, other commands targeting other dies would also be sent to the master queue for those dies.

Turning first to FIG. 6A, the host queue is populated with two plane-level read commands. The controller routes the first command (CMD 1) to the die 0 master queue because the target die for the command is die 0. The first command queued in the Die 0 master queue is then sent to the plane-level queue based on the target plane of the command. In this example, CMD 1 in die 0's master queue is targeting plane 0. Therefore, the command is removed from die 0's master queue and populated in the plane 0 queue. The ready/busy (R/B) signal for plane 0 is then driven to a logic value (e.g., logic low or logic high) to indicate that plane 0 is busy. In the illustrated example, a logic high on the R/B signals indicates ready/idle, and a logic 0 indicates busy. The R/B signals of the other planes still indicate that those planes are idle. The R/B signal for the die also indicates that it is idle because there are currently no die-level commands being serviced.

In FIG. 6B, the second command (CMD 2) in the master queue is sent to the plane 2 queue. In this example, the command on plane 0 is still being serviced, and therefore the R/B signal for plane 0 indicates the plane is busy. In conventional NAND devices, if plane 0 of die 0 was already busy servicing a read command, a subsequent read to different plane would have to wait for the read on plane 0 to finish before the subsequent read could be started. Here, the read on plane 2 can be sent to the plane 2 queue and start asynchronously relative to the read on plane 0. Independent state machines on the NAND die can handle the asynchronous plane-level commands. Once plane 2 starts servicing the read in its queue, the R/B for plane 2 is asserted to indicate the plane is busy. The independent state machines enable independent generation of bias voltages for each of the planes targeted by one of the commands.

In FIG. 6C, the first command on plane 0 has completed. Upon completion of the command, the ready/busy signal for plane 0 transitions to idle. The second command is still being serviced by plane 2, and therefore the R/B signal for plane 2 indicates that the plane is busy. Once the read on plane 2 completes, the R/B signal for plane 2 will also transition to idle. Unlike in the conventional NAND devices, both the start and completion of read commands are independent.

FIGS. 7A and 7B illustrate an example of queuing of both a die-level and a plane-level command. In FIG. 7A, the host queue includes a reset command (CMD 1) and a read command on die 0, plane 2 (CMD 2). The reset command is an example of a die-level command. The reset command causes the NAND die to perform a reset operation. In some implementations, the reset command can be received while the die is busy, and pending operations may be terminated prior to completion. Other die-level commands include, for example, die-level read status, die-level set and get trim, and die-level set and get feature. Other die-level commands are also possible.

The read in this example is a plane-level command. In example illustrated in FIG. 7A, the read command targets plane 2. Both commands are populated in the master queue for die 0 because both commands target die 0. In one example, prior to executing a die-level command, all plane-level commands should be completed. Thus, in one example, the reset command is not routed to the plane-level queues until all the planes are not busy. Once the planes are idle, the die-level command is routed to the plane-level queue(s). There are a variety of ways that the die-level commands can be handled at the plane-level. In this example, the reset command is sent to plane 0's queue, and placeholder commands are sent to the remaining queues. Thus, plane 0 could be considered to be the "master slave plane" that receives die-level commands. The placeholder commands in this example are "dummy" or "shadow" commands that are not actually sent to the NAND die. Instead, the placeholder commands can be sent to the remaining plane-level queues to prevent plane-level commands from being executed on those planes. In one such example, once the die-level command completes, the placeholder commands can be removed from the plane-level queues, and plane-level commands can continue to be serviced. In another example, instead of populating the plane-level queues with dummy commands, the logic can prevent plane-level commands from being sent to the plane-level queues until the die-level command has completed. For example, additional logic for the master queue can determine whether or not it can forward commands to the plane-level queues based on whether a die-level command is being executed. By using dummy commands, the master queue logic can be simplified. Regardless of the implementation, the logic prevents execution of plane-level commands while a die-level command is being executed.

Referring again to FIG. 7A, in response to the reset command on die 0, the die-level ready/busy signal is asserted to indicate the die is busy. Referring to FIG. 7B, after the die-level reset command completes, the die-level read/busy signal indicates the die is idle. Also, after completion of the reset command, the placeholder commands are removed from the plane-level queues and the plane-level read command is routed to the plane-level queue. The plane-level ready/busy signal then indicates the plane is busy (here, plane 2 is busy). After completion of the plane-level read command, the ready/busy signal transitions to idle.

FIGS. 8A-8C illustrate examples of independent plane-level commands. The commands illustrated in FIGS. 8A-8C are examples of commands that a controller (e.g., the controller 304 of FIG. 3) can send to the non-volatile memory. Specifically, FIGS. 8A-8C illustrate a "Set trim by plane" command, a "Get trim by plane" command, a "Set feature by plane" command, a "Get feature by plane" command, a "Status by plane" command, "Read Column" commands, and "Prefix opcode for SLC and TLC entry" commands. Although not shown in FIGS. 8A-8C, in one example, there are also independent plane-level read, program, and erase commands. In one such example, there is no change in the functionality of the read, program, and erase commands, however, the target plane will be indicated in an address cycle of the commands. Different or additional plane-level commands are also possible.

In one example, the "Set trim by plane" command (opcode E7h in the example illustrated in FIG. 8A) is similar to a "set trim" command except that it enables independent trim commands for each plane or group. The set trim by plane command enables modifying settings of the identified plane. In the illustrated example, the set trim command causes settings for the identified plane to be programmed to P1 (Wr_data1). Examples of settings that can be modified by the set trim command include WL/BL (Word Line/Bit Line) voltages during array operations (e.g., program/erase/read/ etc.), program verify levels, read reference values, maximum WL bias value, array operation timeout period, and/or other settings. The settings can be stored in, for example, SRAM, registers, etc. on the memory device.

The set trim command identifies the address (e.g., address and LUN (logical unit)) of the desired setting to be modified. In this example the LUN has the same granularity as a die. In the illustrated example, the "Set trim by plane" command specifies the target plane in bits [6:4] of the third address cycle. After the command and address cycles, the internal controller polls the plane to determine when the set trim operation has completed.

Thus, unlike conventional trim commands, which are limited to setting trim for an entire die, the "Set trim by plane" command enables adjusting settings independently for each plane. As an example of when it would be desirable to independently adjust such settings for different planes: if some planes are experiencing more stress than others, the timing settings can be adjusted to account for the difference in stress (e.g., by relaxing timing settings for one plane).

Similarly, the "Get trim by plane" command (opcode E6h in the example illustrated in FIG. 8A) is similar to a "get trim" command except that it enables independent get trim commands for each plane or group. The "Get trim by plane" command illustrated in FIG. 8A specifies the target plane in bits [6:4] in the third address cycle and enables reading the trim settings for the identified plane.

Features can also be set or read on a plane-level with the "Set feature by plane" and "Get feature by plane" commands. In one example, features include high-level features such as slow read mode, fast read mode, error recovery, etc. Features can be stored in SRAM, registers, etc. on the memory device. Setting a feature involves programming the location specified for the desired feature to invoke, enable, or disable features. Thus, unlike conventional NAND devices in which a single feature profile is used for all planes on the die, each plane can have a different feature profile. Thus, performance can be improved by making optimizations at a plane-level. In the examples illustrated in FIGS. 8A-8B, both the Set feature and Get feature commands indicate the LUN in bits [2:0] of the first address cycle and the plane in bits [6:4] in the first address cycle. For both the Set feature and Get feature by plane commands, the feature address is (FA) is specified in the second address cycle and identifies the specific feature(s) to be set or read. For the Set feature command, the values for the features to be set are sent as write data (Wr_data1-Wr_data4). After the command, address, and data cycles of the Set feature command, the controller can poll at a plane-level to determine whether the set feature plane completed.

In the illustrated example, for the Get feature by plane command, after the command and address cycles, the internal controller polls the target plane to determine when the read data is ready to be clocked out. In the illustrated example, the settings and/or modes are divided into "features" and "trim", however, other implementations may not make a distinction between such settings and/or modes.

To monitor the status on each plane, the controller can issue a plane-level status command (op code 72h in the example illustrated in FIG. 8B). In one example, the controller is required to issue the desired LUN Address in [2:0] and desired Plane Address in [6:4] as part of the address cycle. Unlike conventional NAND devices where status was provided at a die-level, the "Status by plane" command enables the controller to poll the status of individual planes. Thus, in the illustrated example, the "Status by plane" command is similar to the "status" command (op code 70h) except that the plane is indicated in bits [6:4] in the first address cycle in addition to the LUN. Therefore, the controller can poll die-level status or plane-level status depending on what commands were issued to the NAND. The 3D NAND die then returns the status of the target plane on input/output (I/O) pins of the die.

The enhanced Read column commands enable the data output for the desired Column/Plane/LUN address specified in the sequence. Thus, in one example, the enhanced read column enhanced command by plane is issued by the controller after a read command to check status and clock out the data. The sequence includes a read status by plane command (72h) followed by 03h and E0h commands to clock out the data. For example, once the plane-level ready signal indicates the data is ready to be read out (E.g., when RDY_Px=1, where Px is the desired plane), the controller issues the commands to perform the data readout. After the data readout, the controller may queue up more plane-level operations as long as ARDY_Px=1 (where ARDY_Px=1 when the plane is ready to accept a new command).

In one example, the controller can also switch the mode to SLC or TLC in each plane independently. In the example illustrated in FIG. 8C, to enable independent plane-level operations in SLC mode, the internal controller issues Prefix opcode 41h followed by an independent plane-level operation. The NAND then performs independent plane-level read operations in SLC mode only for the selected plane/LUN specified in the array address. Similarly, to enable independent plane-level operations in TLC mode, the controller can issue Prefix opcode 43h followed by the independent plane-level operation. In both Prefix opcodes for SLC entry and TLC entry per plane, auto exit can enabled by default. In one example, at the end of SLC/TLC independent plane-level operation, the NAND will switch back to native mode.

The NAND can support other techniques for switching independent plane operations in SLC or TLC mode. For example, NAND can support a Feature Address 91h method to switch to SLC or TLC mode. To use Ftr_91 during an independent plane-level operation, in one example, the controller is required to use Set feature by plane operation. In one such example, the Auto exit option may not be supported with a Ftr_91 method in independent plane-level operation. In one such example, the controller is responsible to track the mode of each plane. For operations that are not independent plane-level operations, the controller can use Ftr_91 to switch to OTF SLC or OTF TLC by using a traditional set feature by LUN command (e.g., opcode D5h) or a target wide set feature command (e.g., opcode EFh).

The op-codes and sequences described above are examples; other implementations are possible. Additional or different independent plane-level operations are also possible. For example, the NAND can support moving read reference (MRR), Address Cycle Read offset, Read Retry, auto read calibration (ARC) persist, Corrective Read, Auto Read Calibration, Soft Bit Read (SBR), single bit soft bit read (SBSBR), Program Suspend, Erase Suspend, and Nested Suspend operations as independent plane-level operations. For example, the controller can independently configure the MRR latches per plane via the Set Trim by Plane operation, described above. In one example, some features are per-plane while others are per-die. For example, BBD (block by deck) can be at a plane level, while other features are die-level. In the block by deck feature, a physical block is divided into multiple logical blocks by deck. In one example, traditional die-level Set feature commands are still supported for die-level read operations. In one example, to issue any non-plane-level operation on the LUN, the controller is required to complete plane-level operations across all the planes (i.e. RDY_LUN=ARDY_LUN=1) before issuing the die-level operations.

Although the description of the commands illustrated in FIGS. 8A-8C describe the commands as being issued by the controller (e.g., an integrated ASIC controller), other implementations may involve issuing such plane-level commands from an external controller, from the host (e.g., in an open channel SSD system in which the host operating system and/or drivers control management of the NAND), or other control logic.

Figure 9A:
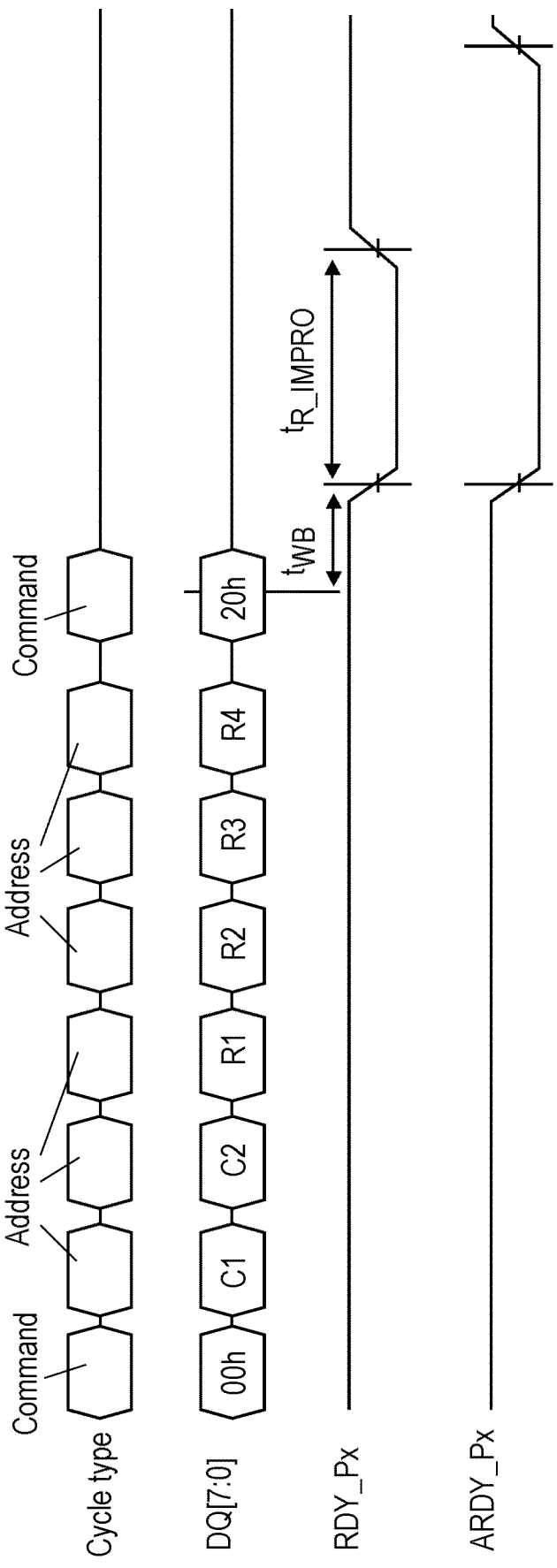
FIGS. 9A-9F are examples of timing diagrams for plane-level commands.

FIGS. 9A-9F are examples of timing diagrams for plane-level commands. FIG. 9A is an example of a timing diagram for an independent multi-plane read operation (IMPRO). In the illustrated example, to issue the IMPRO (00h-20h) command, the controller writes 00h to the command register, followed by address cycles to the address register (illustrated in FIG. 9A as R1-R4 on DQ[7:0]). The command sequence concludes by writing 20h to the command register. The IMPRO operation will be kicked off on the page address in the selected plane. After the time tWB (WE #HIGH to busy), the data is ready to be read out and the controller can continue to issue commands. For example, the controller can then issue multiple 00h-20h sequences asynchronously (without waiting for LUN RDY=1) to trigger the IMPRO operation in unselected planes. The transfer from the flash array to the data register occurs during the time tR_IMPRO. In one example, the NAND will support independent RDY_Px–SR_Px[6] and ARDY_Px–SR_Px[5] per plane, which can be read by the controller via the unique read status command (72h-1xAddr) described above, where RDY indicates if data is ready to be clocked out and ARDY indicates whether the NAND plane is ready to accept commands.

Figure 9B:
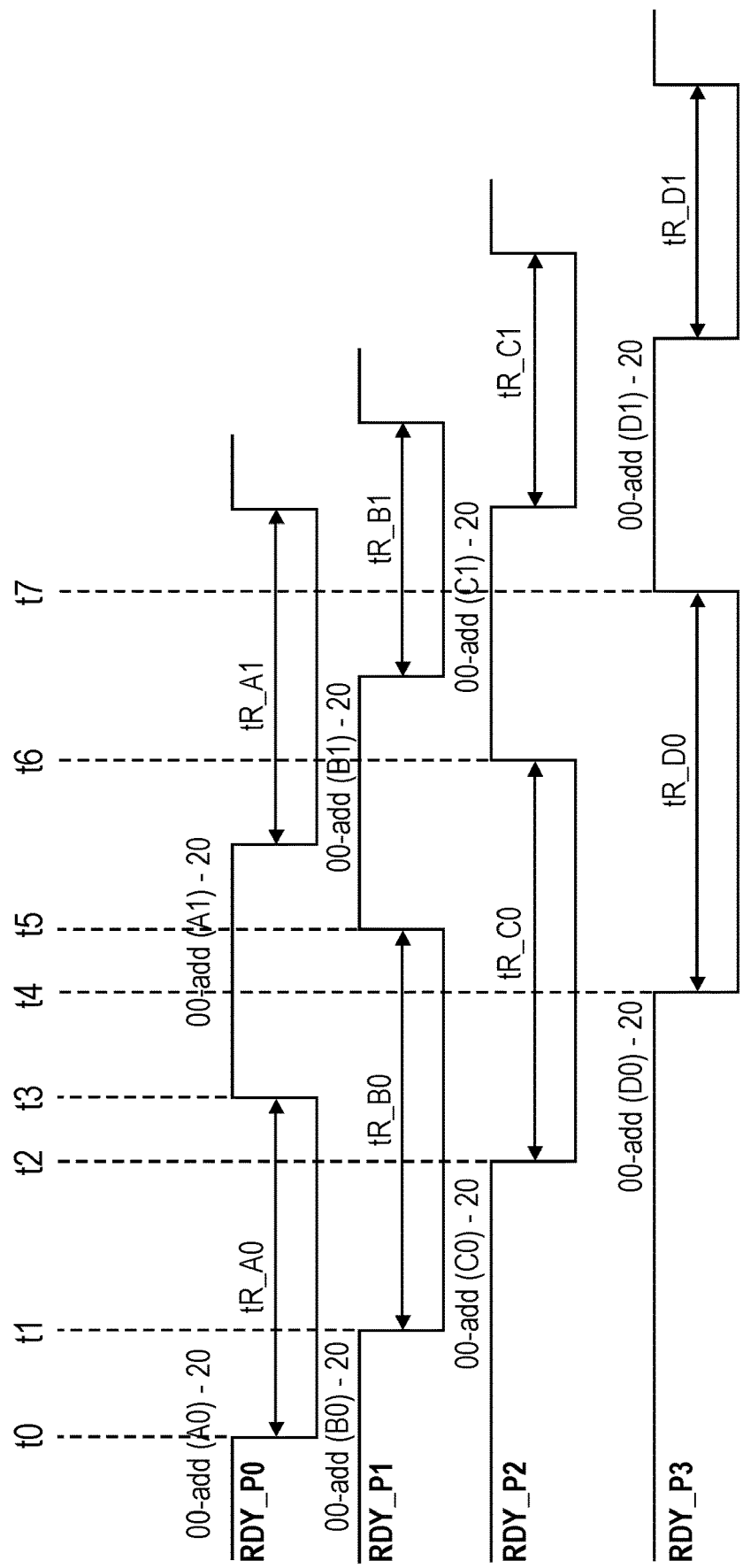

FIG. 9B is an example of a timing diagram for plane-level ready signals. FIG. 9B illustrates independent ready signals for each plane: RDY_P0 for plane 0, RDY_P1 for plane 1, RDY_P2 for plane 2, and RDY_P3 for plane 3. In one example, independent state machines on the NAND die for each plane's status cause the appropriate logic values to be driven on the independent ready signals. The independent ready signals enable each planes' status to be independently updated and tracked, which enables plane-level operations to have independent start and completion times. For example, FIG. 9B shows that a read command to address A0 targeting plane 0 is received first, which causes the RDY_P0 signal to transition to a logic 0 at time t0 to indicate plane 0 is busy. A second read command on plane 1 is received and started while plane 0 is busy. In response to starting the plane 1 command, the RDY_P1 signal transitions to a logic 0 at time t1 to indicate that plane 1 is busy. A third read command on plane 2 is received and started while both plane 0 and plane 1 are busy. In response to starting the plane 2 command, the RDY_P2 signal transitions to a logic 0 at time t2 to indicate that plane 2 is busy. At time t3, the first command on plane 0 completes, causing the RDY_P0 signal to transition to a logic 1.

At time t4, a fourth command is received and started on plane 3, causing the RDY_P3 signal to transition to a logic 0. At time t5, the second command on plane 1 completes, causing the RDY_P1 signal to transition to a logic 1. Similarly, at time t6 the read command on plane 2 completes, and at time t7 the read command on plane 3 completes. Subsequent read commands are also issued on each of the planes after the initial command has completed regardless of the status of the other planes. Thus, each plane can start, service, and complete operations independently of the other planes' status. Therefore, both independency and concurrency can be achieved on all the planes.

Figures 9C, 9D:
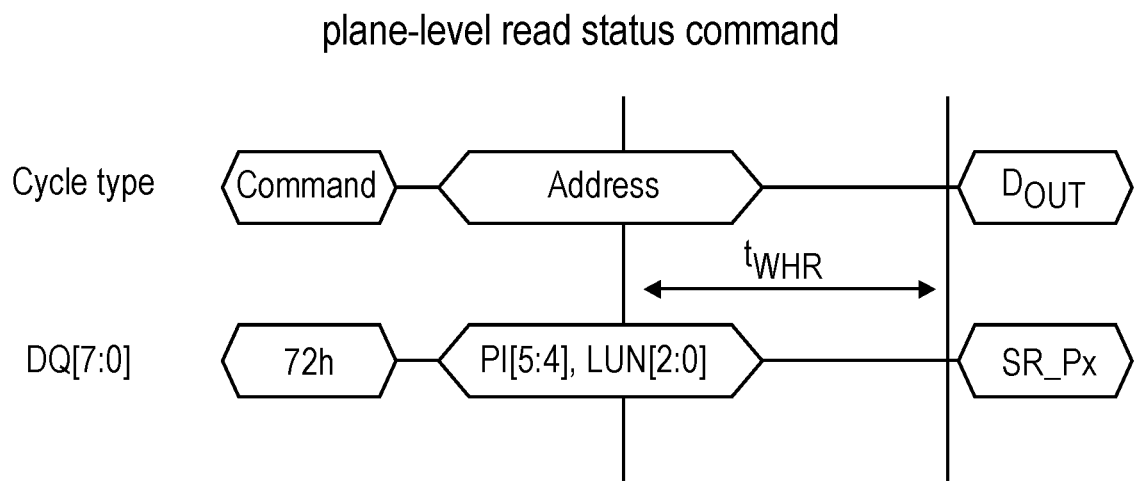

FIG. 9C is an example of a timing diagram for a plane-level status read command. As mentioned above with respect to FIGS. 8A-8C, a plane-level status command enables the controller to monitor the status of each plane individually. In the illustrated example, the controller issues a command 72h, followed by the LUN and plane address as a part of the address cycle. After the time tWHR (WE #HIGH to RE #low), the status SR_Px (where x is the plane number) is output on DQ[7:0] and can be read by the controller.

FIG. 9D illustrates an example of status outputs in response to a plane-level status command. In the illustrated example, the status bits SR0_Px–SR7_Px (where x is the target plane number of the plane-level read status command) are output on the input/output (I/O) pins of the NAND die package (e.g., I/O[7:0]).

Referring first to SR0_Px, a FAIL status bit indicates whether the current operation has failed or succeeded. In this example, SR1_Px is the FAILC status bit, which indicates whether the previous operation failed or succeeded. SR2_Px indicates whether a suspend (e.g., program suspend) command completed successfully. SR3_Px indicates whether the internal temperature of a die or plane has exceeded a predefined range. In response to a high thermal condition, the controller can then perform thermal throttling to reduce the workload to the die or region experiencing the high temperature. In this example, SR4_Px is the PERESET bit, which indicates if a supply voltage (e.g., Vcc) has dropped below some predefined level. SR5_Px is the ARDY_Px bit that indicates whether the plane is ready to accept a new command. SR6_Px is the RDY_Px bit that indicates whether data is ready to be read out from the target plane. SR7_Px is the write protect (WP) bit that puts the plane in a read-only mode.

In a typical implementation, some status bits will operate at the plane level while others will operate at the die level. For example, the FAIL, FAILC, SUSPEND, ARDY, and RDY bits will operate at the plane level, while the temperature, PERESET, and WP bits operate at the die level. In an example where some or all status bits can be read at the plane level, some or all of the status bits may still be read at the die level (e.g., in response to a die-level read status command).

The status bits in FIG. 9D are non-limiting examples. Other implementations may include different status bits. Although in this example 8 status bits are output on 8 I/O pins, other implementations may output fewer or more status bits and/or may utilize fewer or more pins. As mentioned above, some implementations may use one or more dedicated status pins (e.g., a R/B pin) on the die package.

Figure 9E:
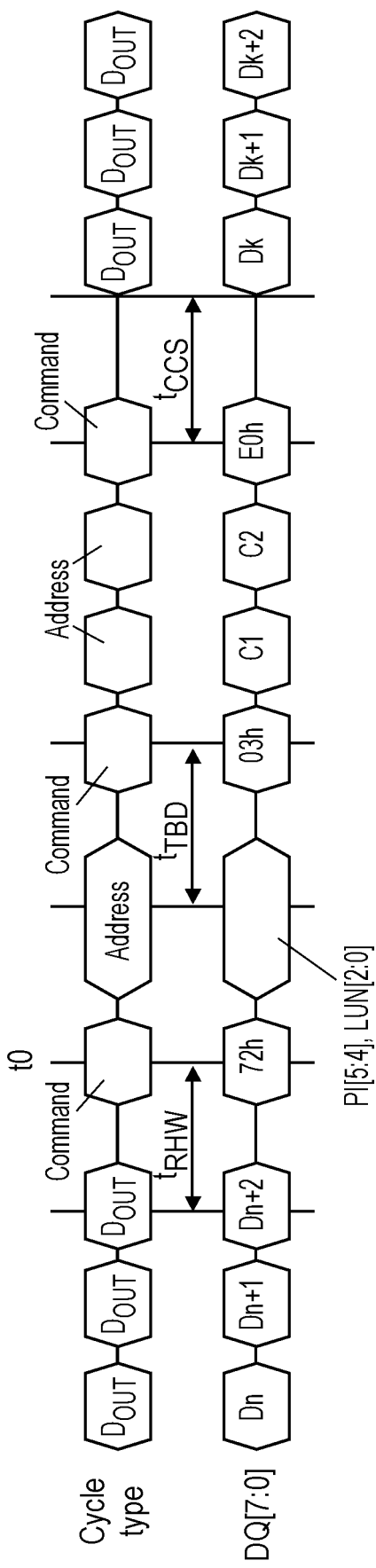

FIG. 9E is an example of a timing diagram for an independent multi-plane read operation (IMPRO) read column enhanced command. The sequence starts with issuing command 72h at t0 after time tRHW (RE #HIGH to WE #LOW). During the address cycle, the LUN and plane address are sent, followed by another command cycle 03h and the column addresses C1 and C2. In the illustrated example, the sequence ends with a final command E0h. The controller then waits at least time tCCS (change column setup time to data or next command) before requesting data output.

Figure 9F:
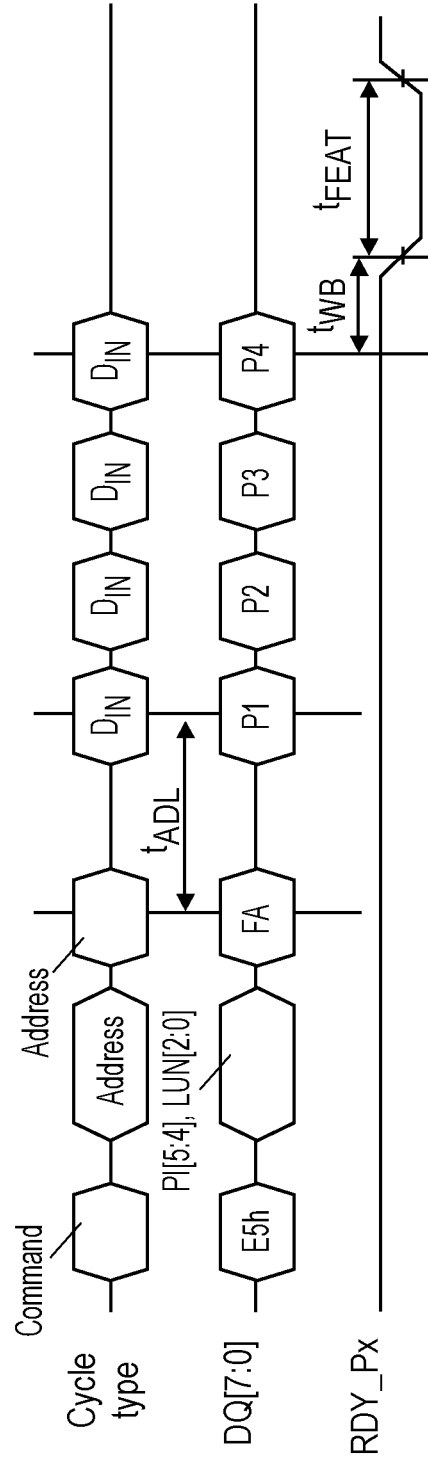

FIG. 9F is an example of a timing diagram for a set feature by plane sequence. As described above with respect to FIGS. 8A-8C, the set feature by plane command starts with E5h on the I/O pins of the NAND during the command cycle, followed by two address cycles to specify the target LUN, plane, and feature address. After time tADL (ALE to data start) the desired data is driven on the I/O pins over four data cycles. After sending the write value, the NAND updates the features accordingly. The ready signal for the plane, RDY_Px, goes low after time tWB (WE #HIGH to busy), and stays low for time tFEAT while the feature is being programmed to indicate the plane is busy.

FIGS. 10A and 10B are examples of flow diagrams of independent multi-plane operations. FIG. 10A illustrates an example of a method performed by a controller (e.g., the controller 304 of FIG. 3) or other entity issuing commands to non-volatile memory. FIG. 10B illustrates an example of a method performed by a non-volatile memory (e.g., NVM 302 of FIG. 3). The methods can be performed by a hardware, software, firmware, or a combination of hardware (e.g., circuitry), software, and firmware. For example, the method 1000 of FIG. 10A can be performed by a hardware controller, such as an ASIC NAND controller, a NAND-aware operating system or firmware, or other control logic. The method 1020 of FIG. 10B can be performed by, for example, hardware or circuitry of the non-volatile memory.

Referring to FIG. 10A, the method 1000 starts with issuing a command to target a first plane of a non-volatile memory, at operation 1002. For example, consider a scenario where a host processor sends a request to a NAND controller to read or program data to a NAND array. The NAND controller determines when the plane is ready to accept a command (e.g., by checking a ready signal by plane), and sends the array command to the target NAND die. In one example, the read or program command indicates the target plane as part of the NAND address section of the command. The NAND die will then indicate that the target plane is busy while it services the command. In one example, the NAND controller has other commands in its queues that target other planes of the same die. While the plane is still busy due to servicing the first command, the controller issues a second command to target a second plane, at operation 1004. The controller then polls the status of the planes to determine when the commands have completed, at operation 1006. For example, the controller can issue a plane-level read status command (e.g., 72h from FIG. 8B) to each plane on which a command is being executed. In one example, the NAND die includes separate state machines for each plane. This can enable the NAND die to accept and process the commands independently for each plane. In one example, the NAND die needs to accept new command even if one of the plane/group is busy. Thus, commands can be sent to a plane independent of the status of other planes to enable independent and concurrent operation by the planes. The controller can then track completion status at a plane-level.

FIG. 10B illustrates an example method from the perspective of the non-volatile memory. The method 1020 begins with receipt of a first command to target a first plane of the NVM, at operation 1022. For example, a 3D NAND memory can receive a command from a NAND controller, such as a read, program, erase, or other command. The command targets one of multiple planes of the target die. The NVM starts to service the first command, at operation 1024. For example, a 3D NAND can start to apply voltage pulses to target cells to program or read the data stored in the cells. Before completion of the first command, a second command targeting a second plane is received while the first command is still being serviced, at operation 1026. The NVM then starts servicing the second command targeting the second plane independent of the status of the first plane, at operation 1028. Thus, the commands can be different types of commands (e.g., one read targeting plane 0 and one write command targeting plane 1), can be for different modes (e.g., one SLC and one TLC), and can start and finish at different times for independent and concurrent operation.

Figure 11:
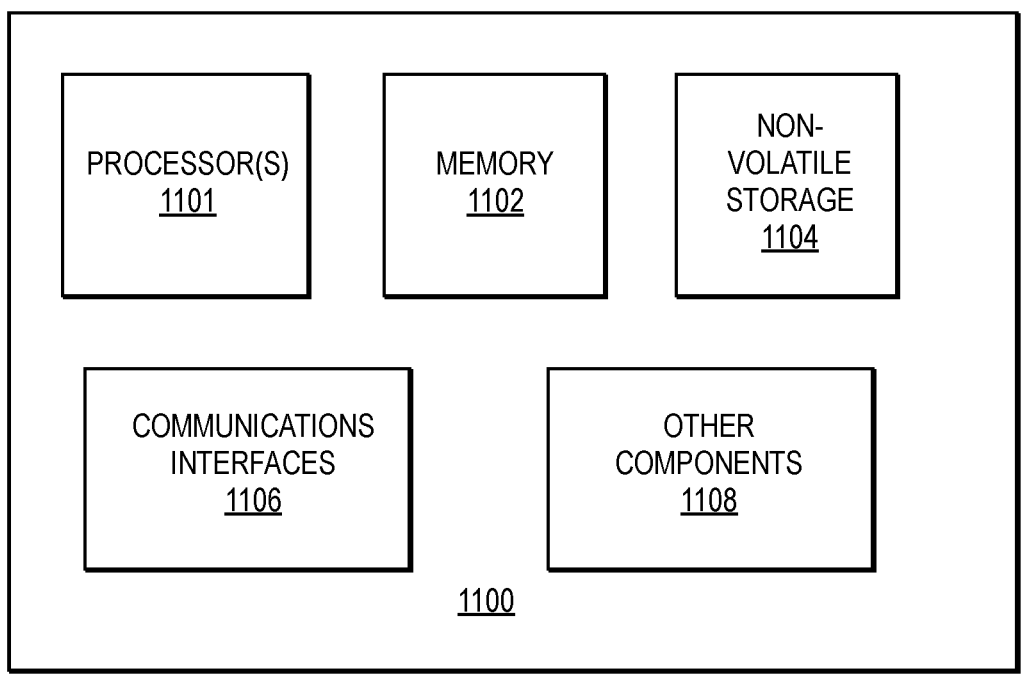
FIG. 11 provides an exemplary depiction of a computing system in which independent multi-plane commands can be implemented.

FIG. 11 provides an exemplary depiction of a computing system 1100 (e.g., a smartphone, a tablet computer, a laptop computer, a desktop computer, a server computer, etc.). As observed in FIG. 11, the system 1100 may include one or more processors or processing units 1101. The processor(s) 1101 may include one or more central processing units (CPUs), each of which may include, e.g., a plurality of general-purpose processing cores. The processor(s) 1101 may also or alternatively include one or more graphics processing units (GPUs) or other processing units. The processor(s) 1101 may include memory management logic (e.g., a memory controller) and I/O control logic. The processor(s) 1101 can be similar to, or the same as, the processor 352 of FIG. 3.

The system 1100 also includes memory 1102 (e.g., system memory), non-volatile storage 1104, communications interfaces 1106, and other components 1108, which may also be similar to, or the same as, components of the host 350 of FIG. 3. The other components may include, for example, a display (e.g., touchscreen, flat-panel), a power supply (e.g., a battery or/or other power supply), sensors, power management logic, or other components. The communications interfaces 1106 may include logic and/or features to support a communication interface. For these examples, communications interface 1106 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1104, which may be the mass storage component of the system. The non-volatile storage 1104 can be similar to, or the same as, the memory device 300 of FIG. 3, described above. The non-volatile storage 1104 can include a solid state drive (SSD), a dual in-line memory module (DIMM), or other non-volatile storage. Non-volatile storage 1104 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 1104 may include mass storage that is composed of one or more SSDs. SSDs can be composed of flash memory chips that are capable of implementing independent NAND memory operations as described above.

Examples for independent and concurrent array operations follow. In one example, an apparatus includes a 3D NAND die including multiple planes of memory cells and control logic. The control logic can include circuitry, firmware, software, or a combination. Some or all of the control logic can be implemented by an internal controller, such as an ASIC. The control logic is to generate commands in response to requests from a host, each of the commands to access one of the planes, queue the commands in separate queues for each of the planes based on a target plane of each of the commands, issue the commands to their target planes independent of other planes' status, and track completion status of the commands independently for each plane. In one example, the control logic to send a command to its target plane is to independently generate bias voltages for each of the planes targeted by one of the commands. In one example, the control logic is to issue a command to target one of the planes when another of the planes is busy. In one example, the control logic is to read data upon completion of a read command from one plane while another plane is busy servicing another read command.

In one example, the control logic to track completion status is to send a command to read status of a target plane, the 3D NAND die to return the status of the target plane on input/output (I/O) pins of the die. In one example, the command to read status of a plane includes one or more bits to specify a plane. In one example, the control logic is to send a command to modify settings of a plane without modification of settings of other planes, the settings including one or more of: wordline voltage for array operation, bitline voltage for array operation, program verify levels, read reference values, maximum WL bias value, and array operation timeout period. In one example, the control logic to queue the commands is to queue the commands in a die-level queue for the die, and route each of the commands from the die-level queue to plane-level queues based on the target plane of each of the commands.

In one example, the control logic is to generate a die-level command in response to a request from the queue and queue the die-level command in the die-level queue. In one such example, the control logic is to route the die-level command to one of the plane-level queues, and prevent execution of plane-level commands while the die-level command is serviced. In one example, the control logic to prevent execution of plane-level commands is to send placeholder commands to at least one of the plane-level queues to prevent execution of plane-level commands. In one example, the control logic to prevent execution of plane-level commands is to prevent routing plane-level commands to the plane-level queues while the die-level command is serviced. In one example, the requests from the host are from a host processor, an accelerator, a memory controller, or a host operating system. In one example, the apparatus comprises a solid state drive (SSD) or a dual in-line memory module (DIMM).

In one example, a controller for a non-volatile memory device includes input/output (I/O) interface circuitry to receive requests from a processor to access a non-volatile memory die, and control logic to generate commands in response to the requests from the processor, each of the commands to access one of multiple planes of the 3D memory die, queue the commands in separate queues for each of the planes based on a target plane of each of the commands, issue the commands to their target planes independent of other planes' status, and track completion status of the commands independently for each plane.

In one example, an article of manufacture including a computer readable storage medium having content stored thereon which when accessed causes processing circuitry to execute operations to perform a method described herein. For example, a method can include issuing, from a controller, a command to a three dimensional (3D) NAND die, the die including multiple planes, the command to target a first plane of the die, issuing a second command to the 3D NAND die to target a second plane while the first plane is busy, and tracking completion of both the first and second commands by polling status of the first plane and the second plane. In one example, a method includes receiving, at a 3D NAND die, a first command from a controller to target a first plane of the 3D NAND die, starting to service the first command, receiving a second command from the controller to target a second plane of the 3D NAND die while the first plane is busy, and starting to service the second command independent of a status of the first plane. Any of the examples herein describing operation at a plane-level can also apply to a group-level. In one example, an apparatus includes a non-volatile memory die (e.g., a 3D NAND die) including multiple groups of memory cells. In one such example, the die includes multiple planes of memory cells, the multiple planes grouped into groups, each of the groups including two or more planes. In one such example, control logic is to generate commands in response to requests from a host, each of the commands to access one of the groups, queue the commands in separate queues for each of the groups based on a target group of each of the commands, issue the commands to their target groups independent of other groups' status, and track completion status of the commands independently for each group.

Thus, techniques described herein enable NAND to perform array operations independently and concurrently on the plane or group level, giving uncompromised performance and QoS upside. Note that although many examples refer to plane-level queues, commands, and state machines, the examples also apply to other groupings such as illustrated in FIG. 4C. In the example illustrated in FIG. 4C, a group includes multiple planes, and there are separate state machines, commands, and queues for the groups.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta"

or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a three-dimensional (3D) NAND die including multiple planes of memory cells; and
   control logic to:
      generate commands in response to requests from a host, each of the commands to access one of the planes;
      queue the commands in separate queues for each of the planes based on a target plane of each of the commands;
      issue the commands to their target planes independent of other planes' status; and
      track completion status of the commands independently for each plane.

2. The apparatus of claim 1, wherein the control logic to send a command to its target plane is to:
   independently generate bias voltages for each of the planes targeted by one of the commands.

3. The apparatus of claim 1, wherein the control logic is to:
   issue a command to target one of the planes when another of the planes is busy.

4. The apparatus of claim 1, wherein the control logic is to:
   read data upon completion of a read command from one plane while another plane is busy servicing another read command.

5. The apparatus of claim 1, wherein the control logic is to:
   send a command to modify settings of a plane without modification of settings of other planes, the settings including one or more of: wordline voltage for array operation, bitline voltage for array operation, program verify levels, read reference values, maximum WL bias value, and array operation timeout period.

6. The apparatus of claim 1, wherein:
   the requests from the host are from: a host processor, a memory controller, or a host operating system.

7. The apparatus of claim 1, wherein:
   the apparatus comprises a solid state drive (SSD) or a dual in-line memory module (DIMM).

8. The apparatus of claim 1, wherein the control logic to track completion status is to:
   send a command to read status of a target plane, the 3D NAND die to return the status of the target plane on input/output (I/O) pins of the 3D NAND die.

9. The apparatus of claim 8, wherein:
   the command to read status of a plane includes one or more bits to specify a plane.

10. The apparatus of claim 1, wherein the control logic to queue the commands is to:
    queue the commands in a die-level queue for the 3D NAND die; and
    route each of the commands from the die-level queue to plane-level queues based on the target plane of each of the commands.

11. The apparatus of claim 10, wherein:
    the control logic is to generate a die-level command in response to a request from the host; and
    the control logic is to queue the die-level command in the die-level queue.

12. The apparatus of claim 11, wherein:
    the control logic is to:
       route the die-level command to one of the plane-level queues, and
       prevent execution of plane-level commands while the die-level command is serviced.

13. The apparatus of claim 12, wherein the control logic to prevent execution of plane-level commands is to:
    send placeholder commands to at least one of the plane-level queues to prevent execution of plane-level commands.

14. The apparatus of claim 12, wherein the control logic to prevent execution of plane-level commands is to:
    prevent routing plane-level commands to the plane-level queues while the die-level command is serviced.

15. A controller for a non-volatile memory device, the controller comprising:
    input/output (I/O) interface circuitry to receive requests from a processor to access a non-volatile memory die;
    control logic to:
       generate commands in response to the requests from the processor, each of the commands to access one of multiple planes of the non-volatile memory die;
       queue the commands in separate queues for each of the planes based on a target plane of each of the commands;
       issue the commands to their target planes independent of other planes' status; and
       track completion status of the commands independently for each plane.

16. The controller of claim 15, wherein the control logic to issue the commands to their target planes is to:
    independently generate bias voltages for each of the planes targeted by one of the commands.

17. The controller of claim 15, wherein the control logic is to:
  issue a command to target one of the planes when another of the planes is busy.

18. The controller of claim 15, wherein the control logic is to:
  read data in response to completion of a read command from one plane while another plane is busy servicing another read command.

19. An article of manufacture comprising a non-transitory computer readable storage medium having content stored thereon which when accessed causes processing circuitry to execute operations to perform a method comprising:
  issuing, from a controller, a first command to a three dimensional (3D) NAND die, the 3D NAND die including multiple planes, the first command to target a first plane of the 3D NAND die;
  issuing a second command to the 3D NAND die to target a second plane while the first plane is busy; and
  tracking completion of both the first and second commands by polling status of the first plane and the second plane.

20. The article of manufacture of claim 19, the method further comprising:
  independently generating bias voltages for each of the planes targeted by one of the commands.

* * * * *